(12) United States Patent
Kolodin et al.

(10) Patent No.: US 8,299,701 B2
(45) Date of Patent: Oct. 30, 2012

(54) LIGHTING DEVICE HAVING ILLUMINATION, BACKLIGHTING AND DISPLAY APPLICATIONS

(75) Inventors: Boris Kolodin, Beachwood, OH (US); Srinath Aanegola, Broadview Heights, OH (US); Emil Vergilov Radkov, Euclid, OH (US)

(73) Assignee: GE Lighting Solutions LLC, Cleveland, OH (US)

( * ) Notice: Subject to any disclaimer, the term of this patent is extended or adjusted under 35 U.S.C. 154(b) by 717 days.

(21) Appl. No.: 12/005,583

(22) Filed: Dec. 27, 2007

(65) Prior Publication Data

US 2009/0167151 A1 Jul. 2, 2009

(51) Int. Cl.
*H01J 1/62* (2006.01)
*H01J 63/04* (2006.01)

(52) U.S. Cl. .......................................... 313/501

(58) Field of Classification Search ........... 313/498–512
See application file for complete search history.

(56) References Cited

U.S. PATENT DOCUMENTS

| 5,874,803 | A * | 2/1999 | Garbuzov et al. | 313/506 |
| 2004/0116033 | A1* | 6/2004 | Ouderkirk et al. | 445/23 |
| 2008/0211386 | A1* | 9/2008 | Choi et al. | 313/503 |

* cited by examiner

*Primary Examiner* — Anh Mai
*Assistant Examiner* — Zachary J Snyder
(74) *Attorney, Agent, or Firm* — Fay Sharpe LLP

(57) ABSTRACT

Provided are a lighting device, a backlighting device, and a display device that comprise a radiation source such as LED and wavelength converting members comprising phosphors. In one embodiment, self-absorption within the devices is suppressed or reduced by placing a selective reflector between two wavelength converting members, and the wavelength converting member emitting light with longer peak wavelength is substantially isolated from the irradiation of another wavelength converting member emitting light with shorter peak wavelength. In other embodiments, the wavelength converting members are arranged in strip configuration; or in adjacent hexagons configuration.

20 Claims, 5 Drawing Sheets

LIGHTING DEVICE HAVING ILLUMINATION, BACKLIGHTING AND DISPLAY APPLICATIONS

BACKGROUND OF THE INVENTION

The present invention is generally related to a lighting device, a backlighting device, and a display device with improved efficiency. The invention can be applied to light emitting devices such as general lighting of phosphor lamp, lighting for signals or automobiles, backlight for LCDs, and displays.

Self-absorption in a lighting device generally occurs when light emissions stay within the device to excite other phosphors, and be absorbed or otherwise prevented from exiting the device, thus reducing performance (intensity) and efficiency. For example, white light is produced for the different applications using down converting phosphors together with suitable light engines. Typical spectral range for light engines now is about 390-460 nm, a near UV-blue spectral region. Two ways are known to produce white light using phosphor down converting process. One way is that a LED blue light engine interacts with so-called "yellow" type phosphor and superposition of the blue pumping light with the broad band fluorescence light emitted by the phosphor. To improve CRI or have warm white light (CCT in the range 2500-3500 K), a red phosphor may be additionally used. However, overlapping of phosphor excitation and emitting spectra, which is the main condition for the self-absorption, reduces the total luminance output. Another way uses RGB phosphor compositions excited by near UV spectra region 390-405 nm. It also has the similar self-absorption problem. As such, suppression of self-absorption remains a need in this field of technology.

Japan patent application 2004088604 discloses a vertical geometry of phosphor layers where phosphor emitting a light of the wavelength near to red color is arranged nearer to the exiting element, and blue phosphor is arranged farther away from the exiting element.

Similar approach is also described for two-component phosphor system in Japan patent application 2003380788. However, the approach cannot suppress self-absorption significantly because, for example, 50% of the emitted green light will be directed to a red phosphor layer, despite that the red phosphor layer is located closer to LED light engine.

Advantageously, the present invention provides a lighting device with increased total output luminance, which employs a novel geometry of wavelength converting members that prevents self-absorption of fluorescence emitted by a certain type of phosphor by other type of phosphor.

BRIEF DESCRIPTION OF THE INVENTION

One aspect of the invention is to provide a lighting device, which comprises a radiation source, a first wavelength converting member, and a second wavelength converting member. The first wavelength converting member absorbs at least a portion of the electromagnetic radiation originated from said radiation source, and emits a first electromagnetic radiation with peak wavelength $\lambda_{e1}$; the second wavelength converting member absorbs at least a portion of the electromagnetic radiation originated from said radiation source, and emits a second electromagnetic radiation with peak wavelength $\lambda_{e2}$; $\lambda_{e1} > \lambda_{e2}$; and the first wavelength converting member is substantially isolated from the irradiation of the second electromagnetic radiation.

In accordance with certain illustrative embodiments shown and described as examples herein, a selective reflector is included in the device and used to selectively reflect at least a portion of the second electromagnetic radiation with peak wavelength $\lambda_{e2}$ away from said first wavelength converting member.

In accordance with certain illustrative embodiments shown and described as examples herein, the lighting device includes a plurality of first wavelength converting members and a plurality of second wavelength converting members, which are configured in alternating strips, straight or curved.

Another aspect of the invention is to provide a backlighting device, which comprises a radiation source, a first wavelength converting member, and a second wavelength converting member. The first wavelength converting member absorbs at least a portion of the electromagnetic radiation originated from said radiation source, and emits a first electromagnetic radiation with peak wavelength $\lambda_{e1}$; the second wavelength converting member absorbs at least a portion of the electromagnetic radiation originated from said radiation source, and emits a second electromagnetic radiation with peak wavelength $\lambda_{e2}$; $\lambda_{e1} > \lambda_{e2}$; and the first wavelength converting member is substantially isolated from the irradiation of the second electromagnetic radiation.

Still another aspect of the invention is to provide a display device, which comprises a radiation source, a first wavelength converting member, and a second wavelength converting member. The first wavelength converting member absorbs at least a portion of the electromagnetic radiation originated from said radiation source, and emits a first electromagnetic radiation with peak wavelength $\lambda_{e1}$; the second wavelength converting member absorbs at least a portion of the electromagnetic radiation originated from said radiation source, and emits a second electromagnetic radiation with peak wavelength $\lambda_{e2}$; $\lambda_{e1} > \lambda_{e2}$; and the first wavelength converting member is substantially isolated from the irradiation of the second electromagnetic radiation.

Numerous advantages and benefits of the present invention will become apparent to those of ordinary skill in the art upon reading and understanding the present invention.

BRIEF DESCRIPTION OF THE DRAWINGS

The invention may take form in various components and arrangements of components, and in various process operations and arrangements of process operations. The drawings are only for purpose of illustrating preferred embodiments and are not to be construed as limiting the invention.

DETAILED DESCRIPTION OF THE INVENTION

Figure 1:
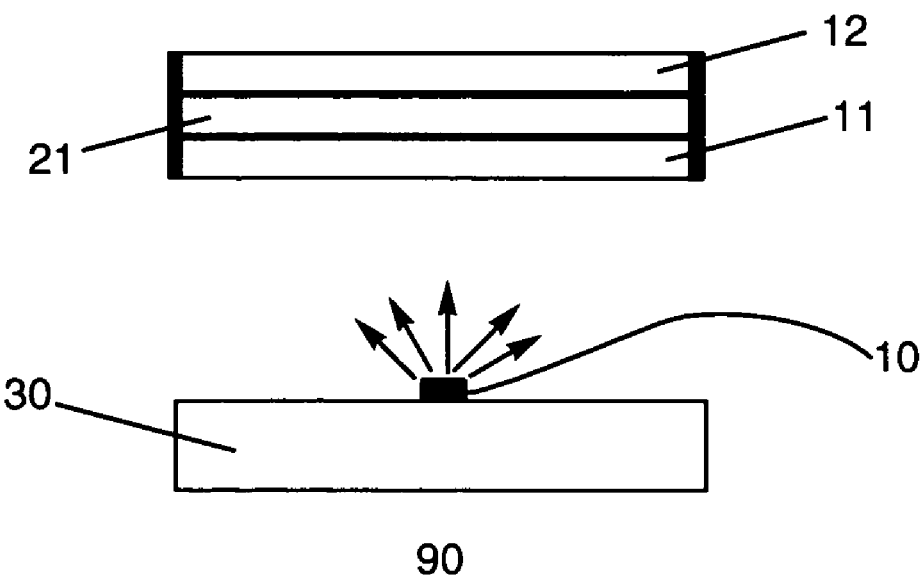
FIG. 1 diagrammatically shows a lighting device using a selective reflector to reduce self-absorption between flat wavelength converting members in an embodiment.

With reference to FIG. 1, a lighting device 90 includes one or more radiation sources 10 such as a laser diode (LD) or a lighting emitting diode (LED) mounted on a support member 30, a first wavelength converting member 11, and a second wavelength converting member 12. A first selective reflector 21 is placed between the two wavelength converting members and functions as a blocking optical element. The two wavelength converting members and the selective reflector are adapted in a vertical geometry. Wavelength converting member 11 and radiation source 10 may be separated by any media, or they may be contacted with each other directly (not shown). In operation state, first wavelength converting member 11 absorbs at least a portion of the electromagnetic radiation originated from radiation source 10, and emits a first electromagnetic radiation with peak wavelength $\lambda_{e1}$; second wavelength converting member 12 absorbs at least a portion of the electromagnetic radiation originated from radiation source 10, and emits a second electromagnetic radiation with peak wavelength $\lambda_{e2}$; and $\lambda_{e1} > \lambda_{e2}$. Selective reflector 21 selectively reflects at least a portion, preferably nearly all, of the second electromagnetic radiation with peak wavelength $\lambda_{e2}$ away from wavelength converting member 11, so it is substantially isolated from the irradiation of the second electromagnetic radiation. In other words, the second electromagnetic radiation is not self-absorbed by another component within device 90 such as wavelength converting member 11. In preferred embodiments, selective reflector 21 only selectively reflects the radiation (as a band, as a single wavelength emission, or as peak emission) that could be absorbed by the wavelength converting member 11; and on the other hand, it transmits all other radiation, particularly that unconverted from the radiation source 10 and that emitted from wavelength converting member 11. For example, selective reflector 21 can be selected from any suitable optical media known in the art such as pigment or dielectric multiplayer reflector with high reflectance for blue, green, or red wavelength band, depending on the specific design of the device.

Radiation source 10 can comprise semiconductors such as BN, SiC, ZnSe, GaN, InGaN, InAlGaN, AlGaN, BAlGaN, and BInAlGaN etc. Si, Zn and so on can be included in these elements as impurity elements and serve as the center of light emission. For example, a nitride semiconductor can efficiently emit light with a short wavelength from the visible region to the ultraviolet region. Homo structure, hetero structure, or double-hetero structure with MIS junction, PIN junction, pn junction, or the like, can be employed as the structure of semiconductor. Various light-emission wavelengths can be selected depending on materials and mixed crystal ratios of semiconductor layer. The semiconductor layer can have a single- or multi-quantum-well structure provided with thin layer(s) for quantum effect. In the case where a nitride semiconductor is employed, a material such as sapphire, spinel, SiC, Si, and ZnO is preferably employed as a substrate for semiconductor. For example, a semiconductor can be formed on the sapphire substrate by using MOCVD. A buffer layer of GaN, AlN, GaAlN, and so on, is formed on the sapphire substrate, and then a nitride semiconductor with pn junction is formed thereon. In an exemplary double-hetero structure, a first contact layer formed of n-type gallium nitride, a first cladding layer formed of n-type aluminum-nitride gallium, an active layer formed of indium-gallium nitride, a second cladding layer formed of p-type aluminum-nitride gallium, and a second contact layer formed of p-type gallium nitride are successively laminated on the buffer layer.

In order to widely provide a current supplied to the light emitting element over the whole area of the p-type semiconductor, a diffusion electrode may be formed on the p-type semiconductor. In addition, p-side and n-side pad electrodes connected to conductive members such as bumps or conductive wires may be formed on the diffusion electrode and the n-type semiconductor, respectively. The p-side and n-side pad electrodes can be electrically connected to conductive members or heat dissipation members that are provided in an insulating member through the conductive wires. Alternatively, the semiconductor light emitting element is mounted in a flip chip mounting manner through solder or bump, and is electrically connected to the support member or the heat dissipation members.

Support member 30 is typically a member that is provided with the radiation source 10 mounted thereon and a conductive wire for supplying electric power to 10, and serves as a support member for supporting other components to achieve sufficient mechanical strength of the device. The supporting member can have various sizes in consideration of heat dissipation characteristics, the output of light emitting device and so on, and have various shapes in consideration of the shape of light emitting device. In addition, in order to control distribution of light, a reflector (not shown) may be provided on a part of the support member.

For example, support member 30 may have inclined walls (not shown) that reflect light from 10 in the direction where the light is observed. The inclined walls can be formed as inner walls of a tapered recessed portion and the inner walls are opposed to 10 mounted in the recessed portion. In addition, a reflector layer may be formed on the inclined walls for excellent reflection of the light from 10. In optional embodiments, device 90 can further include a heat dissipation member (not shown). In order to efficiently dissipate heat conducted from 10 toward the heat dissipation member, if any, support member 30 preferably has high heat conductivity. Ceramics, copper, aluminum, and a phosphor bronze plate can be employed as materials with high heat conductivity. In addition, it is preferably used with silver or palladium that is coated on its surface, or with metal plating such as silver and gold, solder plating or the like that is performed on its surface.

In various embodiments, wavelength converting members 11 and 12 can comprise a phosphor or a mixture of phosphors. For example, member 11 can comprise a red phosphor; member 12 comprises a green (or blue) phosphor; and selective reflector 21 has high reflectance for green (or blue) wavelength band. Alternatively, member 11 can comprise a green phosphor; member 12 comprises a blue phosphor; and selective reflector 21 has high reflectance for blue wavelength band. Red, green and blue phosphors excitable by near UV to blue radiation are known in the art. For the purposes of this application, a red phosphor is one with peak emission value greater than 600 nm, a green phosphor is one with peak emission value from 500 to 600 nm, and a blue phosphor is one with peak emission value less than 500 nm In various embodiments, members 11 and 12 can comprise a phosphor and a binding agent that binds this phosphor. The binding agent can be composed of a transparent resin such as epoxy resin, or a transparent inorganic material produced from a silicone resin or metal alkoxide with high light-resistance as an original material by a sol-gel method, for example. Members 11 and 12 can be applied on a heat dissipation member by various methods, such as screen printing, ink-jet application, potting, and mimeograph printing. In addition, the phosphor may be contained in a transparent heat dissipation member. Members 11 and 12 can also comprise filler and diffusion agent such as barium titanate, titanium oxide, aluminum oxide, silicon oxide, and mixture thereof in the form of particles with different sizes.

Preferred phosphor examples include, but are not limited to, garnet phosphors activated with at least Ce(III), nitride and oxynitride phosphors activated with at least one of Eu(II) and Ce(III), alkaline earth silicate phosphors activated with at least Eu(II), alkaline earth haloapatite phosphors activated with at least Eu(II), alkaline earth aluminate phosphors activated with at least Eu(II), rare-earth oxysulfides activated with at least Eu(III), complex fluoride phosphors activated with Mn(IV); others such as (Zn, Cd)S:Cu; $3.5MgO \cdot 0.5MgF_2 \cdot GeO_2$:Mn; (Mg, Ca, Sr, Ba)$Ga_2S_4$:Eu; and any intra- or intergroup combination thereof. Preferably, at least one of the red phosphor, the green phosphor, and the blue phosphor used in various embodiments of this invention are selected from the preceding examples.

A garnet phosphor has a characteristic garnet structure. As known in the art, phosphors having this structure and typically activated with Ce(III) can have emission spectra with peak wavelengths in the green to red region of the visible spectrum. The most common example of this family is yttrium aluminum garnet doped with Ce(III) (YAG), with a formula $Y_3Al_5O_{12}$:Ce, a green phosphor.

A nitride phosphor contains the nitride ion, typically at least one element selected from the group consisting of Ca, Sr and Ba, and typically at least one element selected from the group consisting of Si and Al, and is activated by at least one from the rare earth elements such as Eu(II) or Ce(III). A common example of this family is $Ca_2Si_5N_8$:Eu, a red phosphor.

An oxynitride phosphor is similar to a nitride phosphor but contains oxide ion as well. Typically, the introduction of oxide ion blue-shifts the emission maximum versus the "pure" nitride phosphors. A common example of this family is $SrSi_2O_2N_2$:Eu, a green phosphor.

An alkaline earth silicate phosphor contains silicate and oxide ions, at least one element selected from the group consisting of Mg, Ca, Sr and Ba, and is activated by at least Eu(II). A common example of this family is $Ba_2SiO_4$:Eu, a green phosphor.

Figure 2:
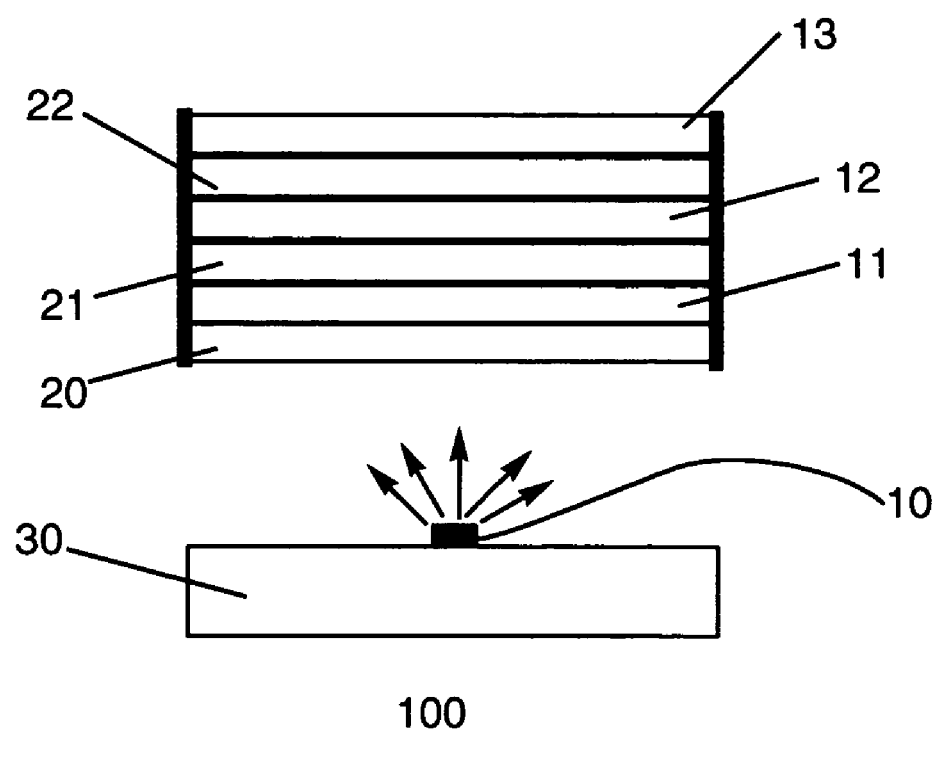
FIG. 2 diagrammatically shows a lighting device using more than one selective reflector to reduce self-absorption between flat wavelength converting members in an embodiment.

Numerous optional components can be added to the device as shown in FIG. 1. With reference to FIG. 2, a lighting device 100 can further include one or more wavelength converting members such as a third wavelength converting member 13, a second selective reflector 22, and a transparent optical media 20. All the wavelength converting members are separated by blocking optical elements such as selective reflectors 21 and 22. Similarly, wavelength converting member 13 absorbs at least a portion of the electromagnetic radiation originated from radiation source 10, and emits a third electromagnetic radiation with peak wavelength $\lambda_{e3}$; and $\lambda_{e1} > \lambda_{e2} > \lambda_{e3}$. Similarly, selective reflector 22 selectively reflects at least a portion, preferably nearly all, of the third electromagnetic radiation with wavelength $\lambda_{e3}$ away from wavelength converting members 11 and 12, so they are substantially isolated from the irradiation of the third electromagnetic radiation. In other words, the third electromagnetic radiation is not self-absorbed by other components within device 100 such as wavelength converting members 11 and 12. In preferred embodiments, selective reflector 22 only selectively reflects the radiation (as a band, as a single wavelength emission, or as peak emission) that could be absorbed by the wavelength converting members 11 and 12; and on the other hand, it transmits all other radiation, particularly that unconverted from the radiation source 10 and those emitted from wavelength converting members 11 and 12. For example, selective reflector 22 can be selected from any suitable optical media known in the art such as pigment or dielectric multiplayer reflector with high reflectance for blue, green, or red wavelength band, depending on the specific design of the device.

Transparent optical media 20 may be made of any suitable material known in the art, such as glass, fluoropolymer films, hard silicones and thermoplastic materials.

In various embodiments, wavelength converting members 11, 12 and 13 can comprise a phosphor or a mixture of phosphor. For example, member 11 can comprise a red phosphor; member 12 comprises a green phosphor; member 13 comprises a blue phosphor; selective reflector 21 has high reflectance for green wavelength band; and selective reflector 22 has high reflectance for blue wavelength band.

Figure 3:
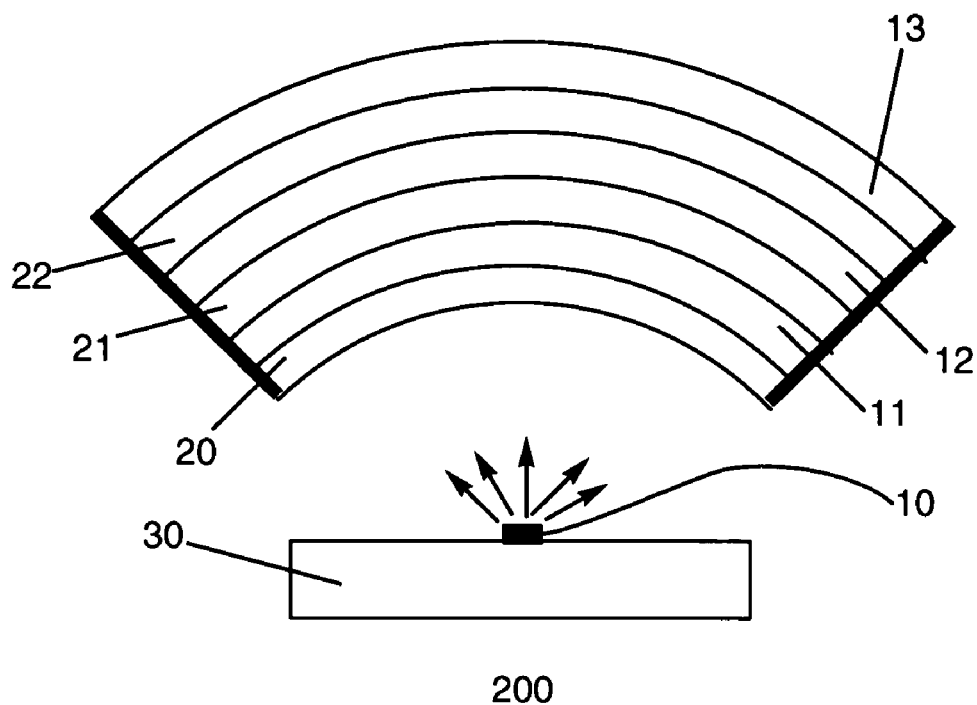
FIG. 3 diagrammatically shows a lighting device using one or more selective reflectors to reduce self-absorption between curved wavelength converting members in an embodiment.

The devices of FIGS. 1 and 2 can take any form that is adapted to its surrounding environment, or according to the devices' intended purpose. For example, some or all wavelength converting members, the selective reflector(s), and the transparent optical media can take a desirable shape, either flat or curved or combination thereof. With reference to FIG. 3, a lighting device 200 includes one or more radiation sources 10 such as a LED mounted on a support member 30, curved wavelength converting members 11, 12, and 13; curved selective reflectors 21 and 22; and curved transparent optical media 20.

For applications such as flat panels, rigid substrate such as glass is preferred. For shaped members 11, 12, and 13, thermoplastics are preferably used. For example, actual phosphor deposition can be done by conformal coating flat substrate sheets followed by thermal forming into useful shapes. Conformal coating process provides excellent CCT stability and reproducibility. Also, patterned phosphor layer can be deposited using this approach too.

Figure 4:
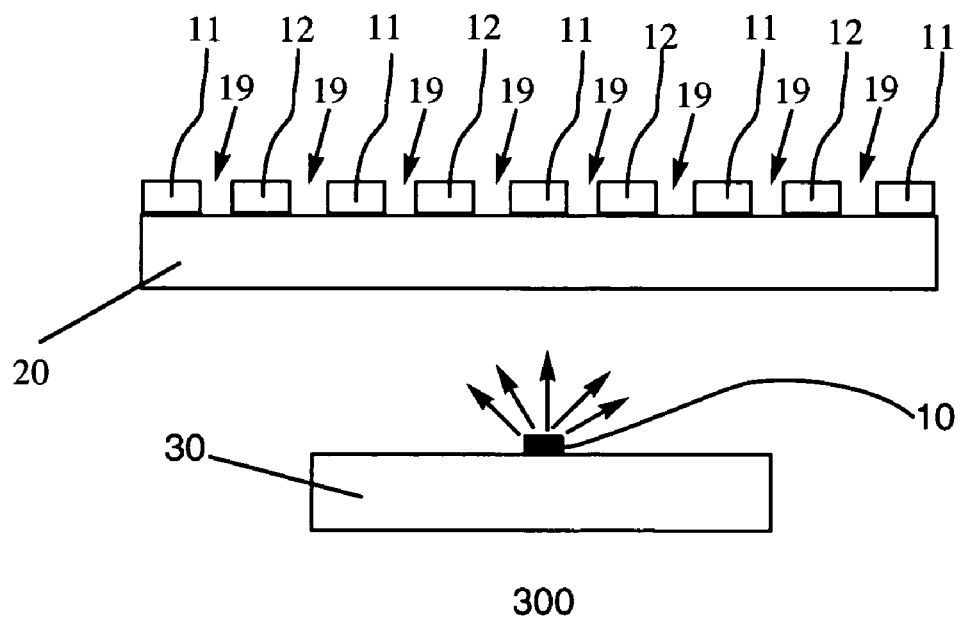
FIG. 4 diagrammatically shows a lighting device in which two different wavelength converting members are arranged in strip configuration to reduce self-absorption between the members in an embodiment.

With reference to FIG. 4, a lighting device 300 includes one or more radiation sources 10 such as a UV LED mounted on a support member 30, a plurality of first wavelength converting members 11 and a plurality of second wavelength converting members 12 on a transparent optical media 20. Wavelength converting members 11 and 12 are configured in alternating strips as the lateral layout, with or without spaces 19 between them. Generally speaking, optimal strip dimensions should have a large surface area to side surface area ratio, to minimize interactions between converting members with different wavelengths. In optional embodiments, some or all spaces 19, if any, are partially or fully filled with non-transparent optical material. In this case, the requirement for the surface area to side surface area ratio as described above may be relaxed or even ignored. In the operation state, first wavelength converting members 11 absorb at least a portion of the electromagnetic radiation originated from radiation source 10, and emits a first electromagnetic radiation with peak wavelength $\lambda_{e1}$; second wavelength converting members 12 absorb at least a portion of the electromagnetic radiation originated from radiation source 10, and emits a second electromagnetic radiation with peak wavelength $\lambda_{e2}$; and $\lambda_{e1} > \lambda_{e2}$. Because of the relative geometry between the strips, and the non-transparent optical material filled in spaces 19, wavelength converting members 11 are substantially isolated from the irradiation of the second electromagnetic radiations.

In other words, the second electromagnetic radiation is not self-absorbed by other components within device 300 such as wavelength converting members 11.

Figure 5:
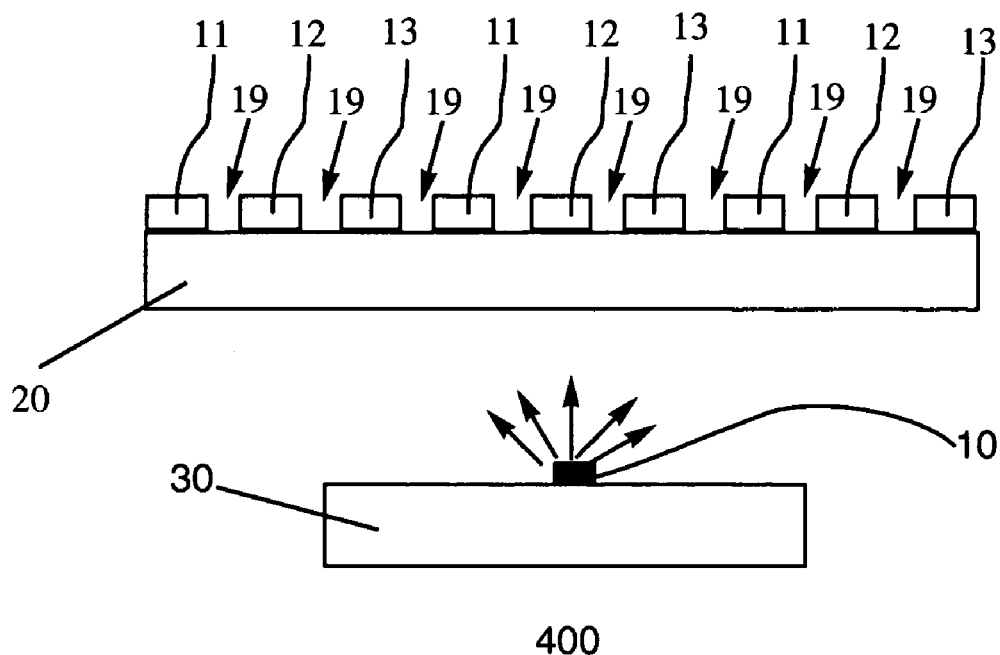
FIG. 5 diagrammatically shows a lighting device in which more than two different wavelength converting members are arranged in strip configuration to reduce self-absorption between the members in an embodiment.

Numerous optional components can be added to the device as shown in FIG. 4. With reference to FIG. 5, a lighting device 400 further includes a plurality of third peak wavelength converting members 13 on transparent optical media 20. Wavelength converting members 11, 12, and 13 are configured in alternating strips as the lateral layout, with or without spaces 19 between them. In optional embodiments, some or all spaces 19, if any, are partially or fully filled with non-transparent optical material. In operation state, third wavelength converting members 13 also absorb at least a portion of the electromagnetic radiation originated from radiation source 10, and emits a third electromagnetic radiation with peak wavelength $\lambda_{e3}$; and $\lambda_{e2} > \lambda_{e3}$. Because of the relative geometry between the strips, and the non-transparent optical material filled in spaces 19, wavelength converting members 11 and 12 are substantially isolated from the irradiation of the third electromagnetic radiations. In other words, the third electromagnetic radiation is not self-absorbed by other components within device 400 such as wavelength converting members 11 and 12.

Figure 6:
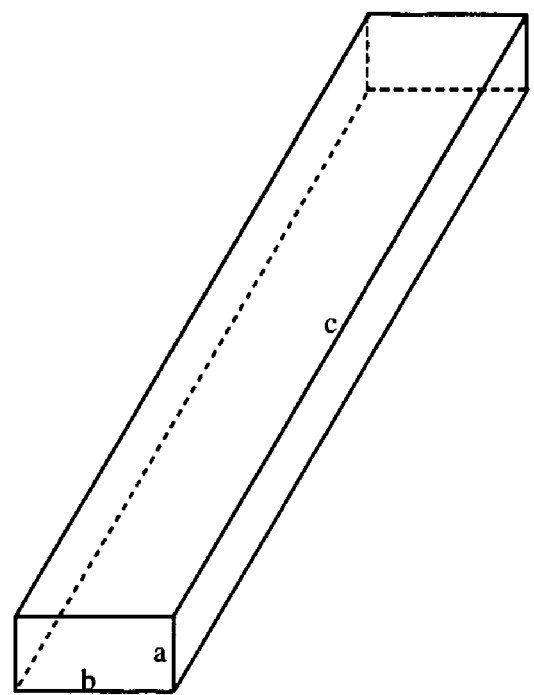
FIG. 6 diagrammatically shows a shape of the wavelength converting strips used in FIGS. 4 and 5, that is, a straight strip.
Figure 7:
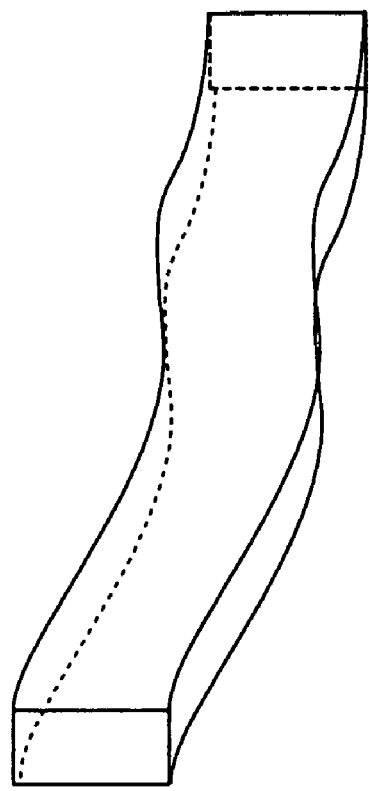
FIG. 7 diagrammatically shows a shape of the wavelength converting strips used in FIGS. 4 and 5, that is, a curved strip.

The strips in FIGS. 4 and 5 can take any form that is adapted to their environment, or according to the devices' intended purpose. For example, FIGS. 6 and 7 show two strips with different shapes, flat and curved respectively. In various embodiments, each strip may have has a width of from about 0.5 mm to about 1.5 mm, and a thickness of from about 0.05 mm to about 0.15 mm. There is no specific limitation on the length of the strip, as long as it meets the design requirement of the lighting device such as size and dimension.

Figure 8:
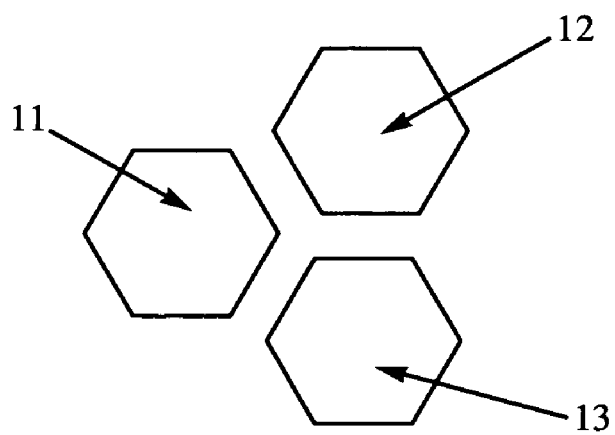
FIG. 8 diagrammatically shows different wavelength converting members in a lighting device take the shape of hexagonal cells and are adjacently arranged to reduce self-absorption between the members.

The wavelength converting members in FIGS. 4 and 5 may be modified into any other suitable shapes. For example, FIG. 8 shows different wavelength converting members take the shape of hexagonal cells and are adjacently arranged to each other.

Figure 9:
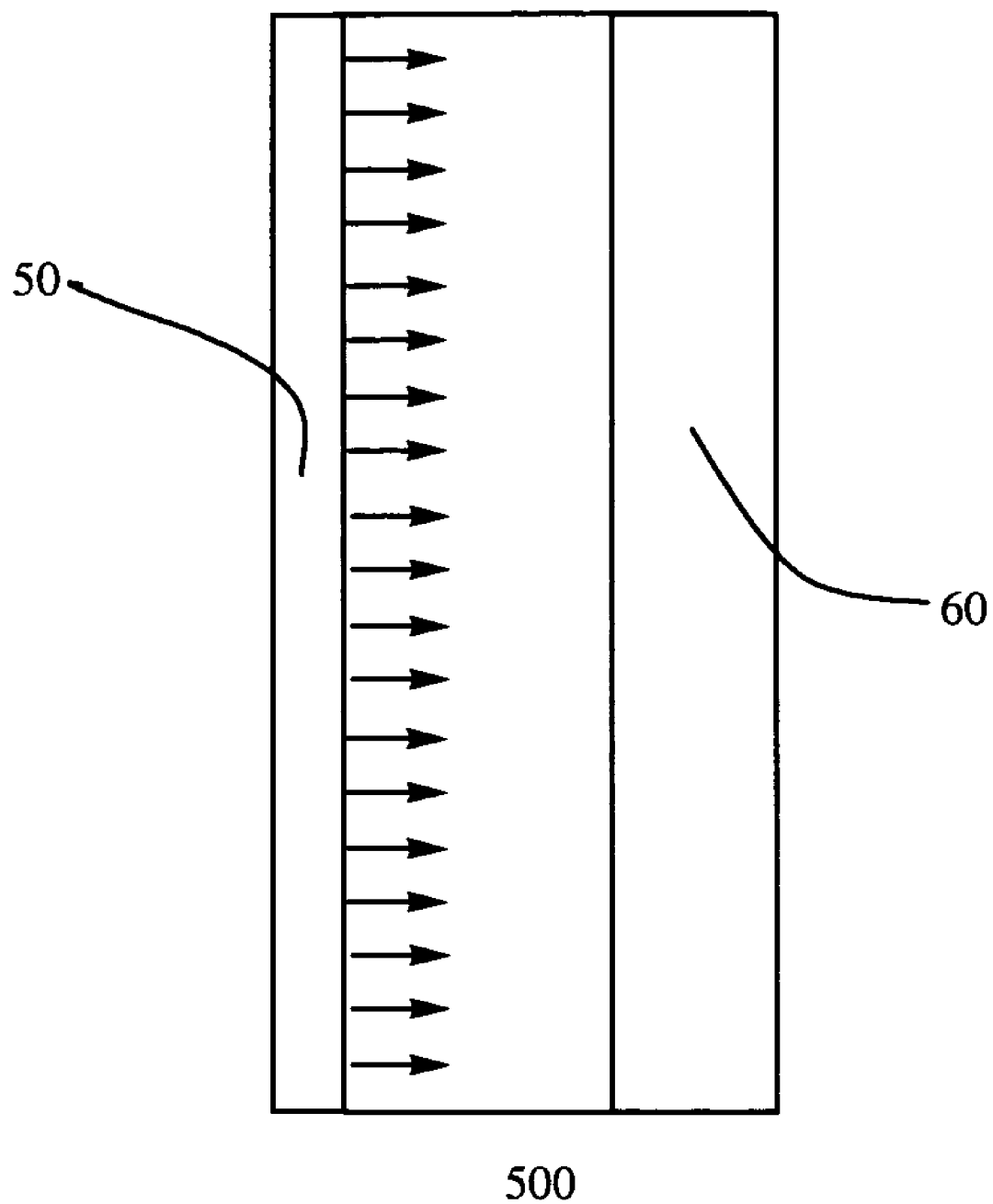
FIG. 9 diagrammatically shows a display device backlit with a lighting device according to an embodiment of the invention.

With reference to FIG. 9, a display device 500 such as a LCD display includes a backlighting device 50 coupled with and an imaging member 60 such as a LCD panel. Backlighting device 50 can include one or more of the lighting device as described above, and function as the illumination source for member 60. Generally, imaging member 60 is lit by 50 from behind to make the screen brighter. General LCD technology is known to a skilled person in the art. For example, imaging member 60 can have a laminated structure (not shown) including a polarizing filter which is irradiated by 50 and controls the light entering and leaving; a glass substrate that stops the filtering of electricity from electrodes; transparent electrodes that drive the LCD and are made from highly transparent material, so as to avoid interference with the quality of the image's integrity; an alignment layer that is a film used to align the molecules in a fixed direction; liquid crystals; a spacer that maintains a uniform space between two glass plates; and a color filter to express color through the use of Red, Green and Blue filters.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A lighting device, which comprises a single radiation source, a first wavelength converting member, a second wavelength converting member, and a third wavelength converting member, wherein:
   said first wavelength converting member absorbs at least a portion of the electromagnetic radiation originated from said single radiation source, and emits a first electromagnetic radiation with peak wavelength $\lambda_{e1}$,
   said second wavelength converting member absorbs at least a portion of the electromagnetic radiation originated from said single radiation source, and emits a second electromagnetic radiation with peak wavelength $\lambda_{e2}$;
   said third wavelength converting member absorbs at least a portion of the electromagnetic radiation originated from said single radiation source and emits a third electromagnetic radiation with peak wavelength $\lambda_{e3}$;

$\lambda_{e1} > \lambda_{e2} > \lambda_{e3}$; and said first wavelength converting member is substantially isolated from the irradiation of the second electromagnetic radiation, wherein said lighting device further includes a first selective reflector located between said first and second wavelength converting member, and a second selective reflector between said second wavelength converting member and said third wavelength converting member, wherein said first selective reflector is configured to selectively reflect radiation capable of being absorbed by said first wavelength converting member.

2. The lighting device according to claim 1, wherein said first selective reflector selectively reflects at least a portion of the second electromagnetic radiation with peak wavelength $\lambda_{e2}$ away from said first wavelength converting member.

3. The lighting device according to claim 2, wherein the first selective reflector comprises a pigment or dielectric multiplayer reflector.

4. The lighting device according to claim 2, wherein said first wavelength converting member comprises a red phosphor, and said second wavelength converting member comprises a green phosphor; or wherein said first wavelength converting member comprises a green phosphor, and said second wavelength converting member comprises a blue phosphor.

5. The lighting device according to claim 4, wherein at least one of the red phosphor, the green phosphor, and the blue phosphor are selected from garnet, nitride, oxynitride or alkaline earth silicate phosphors.

6. The lighting device according to claim 1, wherein said second selective reflector selectively reflects at least a portion of the third electromagnetic radiation with peak wavelength $\lambda_{e3}$ away from said first wavelength converting member and said second wavelength converting member.

7. The lighting device according to claim 6, wherein said second selective reflector is positioned between said second wavelength converting member and said third wavelength converting member.

8. The lighting device according to claim 6, wherein the second selective reflector comprises a pigment or dielectric multiplayer reflector.

9. The lighting device according to claim 6, wherein said first wavelength converting member comprises a red phosphor, said second wavelength converting member comprises a green phosphor, and said third wavelength converting member comprises a blue phosphor.

10. The lighting device according to claim 9, wherein at least one of the red phosphor, the green phosphor, and the blue phosphor are selected from garnet, nitride, oxynitride or alkaline earth silicate phosphors.

11. The lighting device according to claim 1, including a plurality of said first wavelength converting members and a plurality of said second wavelength converting members, which are configured in alternating strips.

12. The lighting device according to claim 11, wherein each strip has a width of from about 0.5 mm to about 1.5 mm.

13. The lighting device according to claim 11, wherein each strip has a thickness of from about 0.05 mm to about 0.15 mm.

14. The lighting device according to claim 11, further including a plurality of third wavelength converting members; and said first, second and third wavelength converting members are configured in alternating strips.

15. The lighting device according to claim 12, wherein said first wavelength converting member comprises a red phosphor, said second wavelength converting member comprises a green phosphor, and said third wavelength converting member comprises a blue phosphor.

16. The lighting device according to claim 1, including at least a plurality of said first wavelength converting members, said second wavelength converting members, and said third wavelength converting members, which take the shape of hexagonal cells and are horizontally adjacent and arranged in sequential repetition to reduce self-absorption between them.

17. The lighting device according to claim 1, wherein the radiation source is a LED.

18. The lighting device according to claim 1, which emits white light.

19. A backlighting device, which comprises a radiation source, a first wavelength converting member, a second wavelength converting member, and a third wavelength converting member, wherein:
said first wavelength converting member absorbs at least a portion of the electromagnetic radiation originated from said radiation source, and emits a first electromagnetic radiation with peak wavelength $\lambda_{e1}$;
said second wavelength converting member absorbs at least a portion of the electromagnetic radiation originated from said radiation source, and emits a second electromagnetic radiation with peak wavelength $\lambda_{e2}$,
said third wavelength converting member absorbs at least a portion of the electromagnetic radiation originated from said radiation source and emits a third electromagnetic radiation with peak wavelength $\lambda_{e3}$;

$\lambda_{e1} > \lambda_{e2} > \lambda_{e3}$; and said first wavelength converting member is substantially isolated from the irradiation of the second electromagnetic radiation, wherein said lighting device further includes a first selective reflector located between said first and second wavelength converting member, and a second selective reflector between said second wavelength converting member and said third wavelength converting member, wherein said first selective reflector is configured to selectively reflect radiation capable of being absorbed by said first wavelength converting member, and wherein said first wavelength converting member comprises a red phosphor, said second wavelength converting member comprises a green phosphor, and said third wavelength converting member comprises a blue phosphor.

20. A display device, which comprises a radiation source, a first wavelength converting member, and a second wavelength converting member, wherein
said first wavelength converting member absorbs at least a portion of the electromagnetic radiation originated from said radiation source, and emits a first electromagnetic radiation with peak wavelength $\lambda_{e1}$,
said second wavelength converting member absorbs at least a portion of the electromagnetic radiation originated from said radiation source, and emits a second electromagnetic radiation with peak wavelength $\lambda_{e2}$;

$\lambda_{e1} > \lambda_{e2}$; and said first wavelength converting member is substantially isolated from the irradiation of the second electromagnetic radiation, wherein said first and second wavelength converting members include at least a plurality of first wavelength converting members and second wavelength converting members, which take the shape of hexagonal cells and are horizontally adjacent and arranged in sequential repetition to reduce self-absorption between them.

* * * * *